(12) United States Patent
Theng-Hui

(10) Patent No.: US 6,877,649 B2
(45) Date of Patent: Apr. 12, 2005

(54) CLAMP POST HOLDER

(75) Inventor: Kek Theng-Hui, Singapore (SG)

(73) Assignee: Agilent Technologies, Inc., Palo Alto, CA (US)

( * ) Notice: Subject to any disclaimer, the term of this patent is extended or adjusted under 35 U.S.C. 154(b) by 122 days.

(21) Appl. No.: 10/349,574

(22) Filed: Jan. 22, 2003

(65) Prior Publication Data
US 2004/0140339 A1 Jul. 22, 2004

(51) Int. Cl.[7] .......................... B23K 37/00; B23K 31/00
(52) U.S. Cl. ..................... 228/4.5; 228/47.1; 228/180.5
(58) Field of Search ............................... 228/4.5, 180.5, 228/47.1, 48, 49.1

(56) References Cited

U.S. PATENT DOCUMENTS 3,894,671 A * 7/1975 Kulicke et al. .............. 228/4.5
5,154,339 A * 10/1992 Takeuchi et al. ........... 228/47.1
6,126,062 A * 10/2000 Evers et al. ................. 228/212
6,379,363 B1 * 4/2002 Herrington et al. .......... 606/79

* cited by examiner

Primary Examiner—Lynne R. Edmondson

(57) ABSTRACT

A clamp post holder has a mounting portion for mounting on a wire bonding machine, and a clamp post holding portion, which holds a clamp post. The mounting portion and post holding portion are separated by a slot except for a connecting portion. A screw passes through a threaded hole in the clamp post holding portion into the slot, with its end abutting the mounting portion. By turning the screw, the clamp post holding portion is pulled away from the mounting portion, thereby moving the clamp post. This allows fine adjustment of the positioning of a clamp member on the clamp post.

20 Claims, 3 Drawing Sheets

CLAMP POST HOLDER

FIELD OF THE INVENTION

The invention relates to a clamp post holder and clamp, for example for use in a lead frame wire-bonding machine.

BACKGROUND TO THE INVENTION

A semiconductor device typically contains a semiconductor chip that is mounted on a die attach pad, with a lead frame having a number of leads that extend inwards from the edges of the lead frame. During fabrication of the semiconductor device, electrical connections are established between bond pads on the semiconductor chip and predetermined ones of those leads. This is achieved through a wire bonding process in which one end of a wire is attached to each bond pad of the semiconductor chip and the other end of the wire to a point on the appropriate lead.

During the wire bonding process, strips of lead frames, in which the semiconductor chips are already mounted, are loaded into a magazine in a wire bonding apparatus. They are taken out of the magazine and positioned for wire bonding to take place in each lead frame. After the wire bonding process has been completed, the semiconductor devices are sent for further processing and packaging.

The wire used is usually of a small diameter. The bond pads are small and the leads are small. A clamping device is typically employed to hold the lead frame, more particularly to hold the leads of the lead frame down against a heater plate as the wire bonding process takes place. This is to ensure correct placement and efficient heat transfer. The structure of such clamps varies, but they include a clamp member to hold down the leads. The clamp member is held in position on a clamp post that is mounted in a clamp post holder. The holder in turn is securely mounted to the wire bonding apparatus.

Because the leads are small, the clamps have to be positioned accurately. Moreover, the clamps must ensure no gap between the lead frame and the heater plate. If that does not happen, the leads are not held down correctly and firmly, and the wire bonds may be poor. There is also the possibility that the clamp member may get in the way of the wire bonding.

To date, setting up the clamps has been a rather time consuming and inefficient process. The clamp member has been fixedly held in position on the clamp post. The clamp post has been fixedly held in position in the clamp post holder. The clamp post holder has been fixedly held in position on the wire bonding apparatus. There has been no means of adjustment beyond changing the height of the clamp post holder and thereby the clamp member by putting shims between the clamp post holder and the wire bonding apparatus. However, it takes trial and error to get the appropriate thickness. Thus, each time the clamp post holder has to be dismounted and re-tightened. This means that the calibration process is very time consuming and annoying, especially if no thickness of available shims will provide exactly the thickness required.

SUMMARY OF THE INVENTION

According to one aspect of the invention, there is provided a clamp post holder. The holder has a mounting portion for mounting the holder and a post holding portion for holding a clamp post and connected to the mounting portion by a connecting portion. There is also an operable threaded member (e.g., a screw or bolt) having a lengthwise axis. The threaded member passes from one of the mounting portion and post holding portion to the other of the mounting portion and post holding portion. Operation of the threaded member causes rotation of the post holding portion relative to the mounting portion about the connecting portion.

Thus, the position of a clamp post in the post holding portion can be fine adjusted by operation of the threaded member, e.g. turning a screw (when the threaded member is a screw).

DETAILED DESCRIPTION

Figure 1:
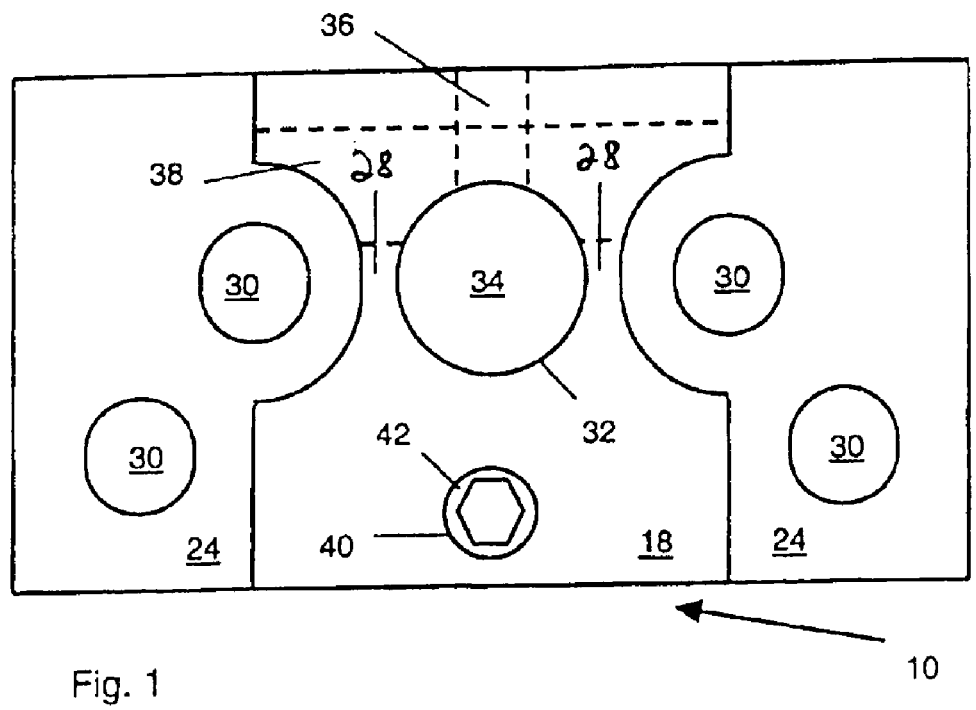
FIG. 1 is a top view of an embodiment of the invention.
Figure 2:
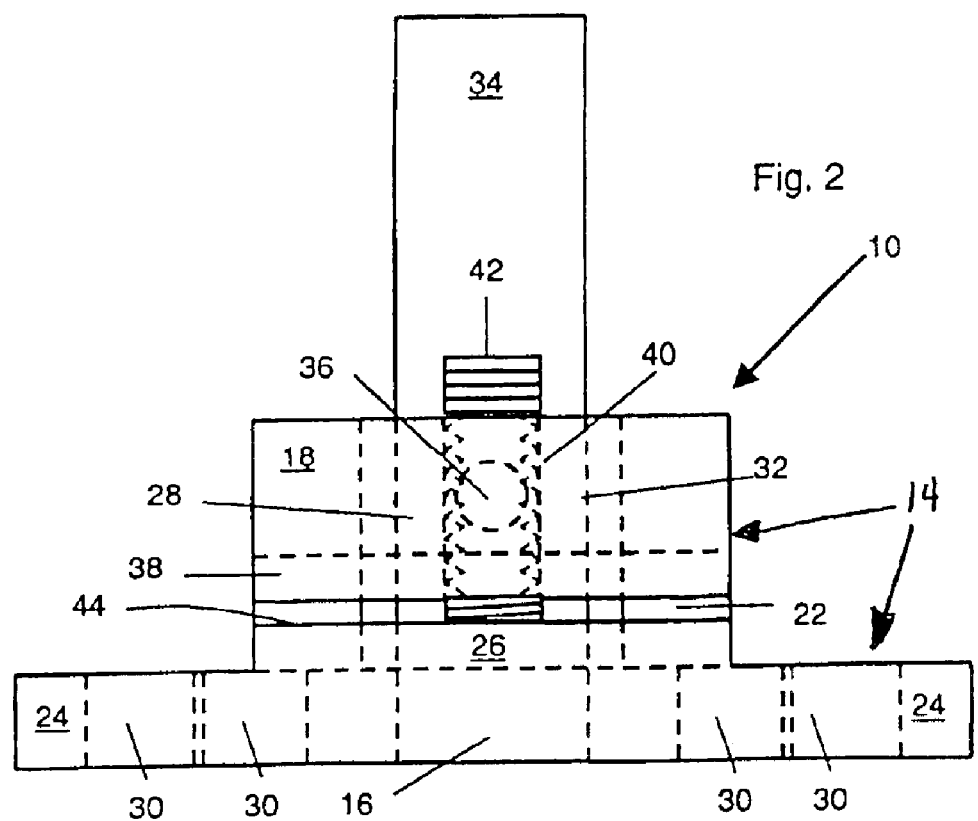
FIG. 2 is a front view of the embodiment of FIG. 1.
Figure 3:
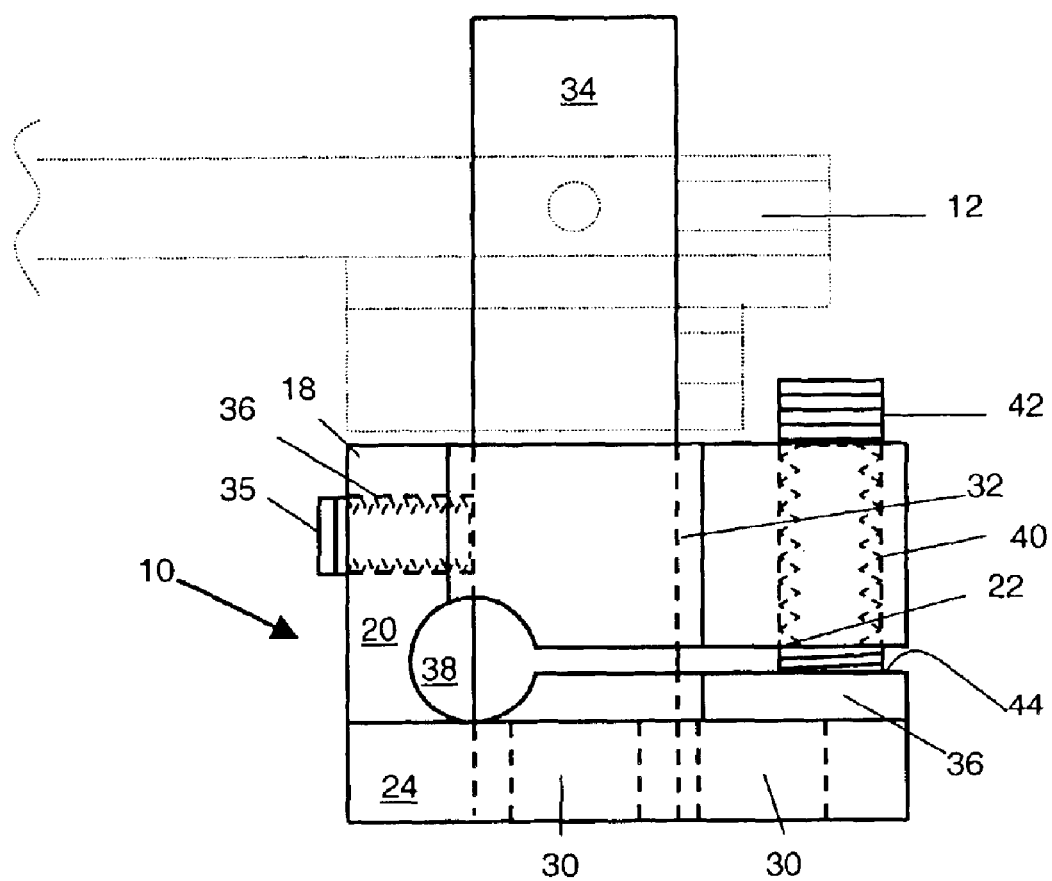
FIG. 3 is a side view of the embodiment of FIG. 1, with the positioning of a clamp member shown.
Figure 4:
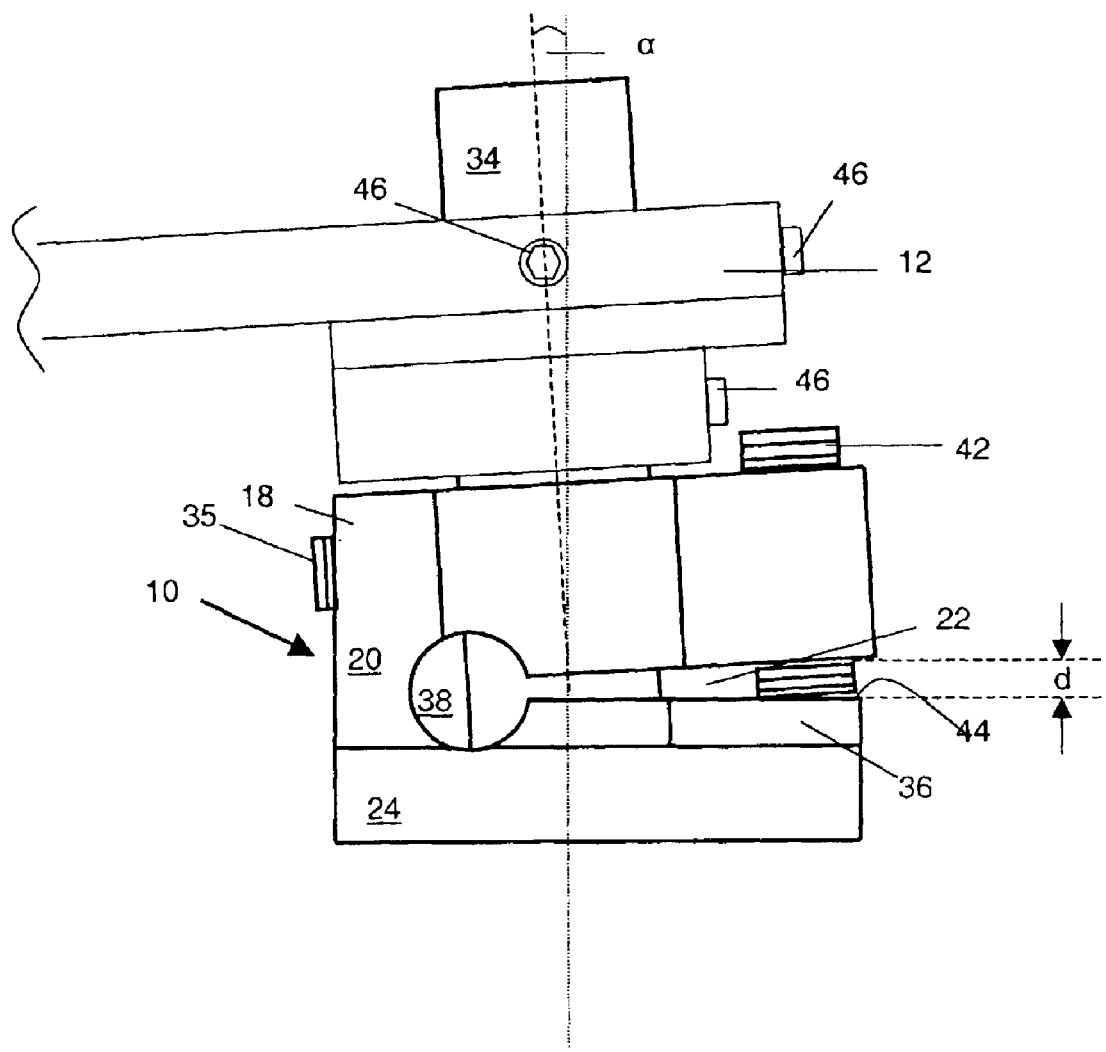
FIG. 4 is a side view of the embodiment of FIG. 1, with a clamp member added and in use.

FIG. 1 shows the top view of a clamp post holder 10 in accordance with one embodiment of the invention. FIG. 2 is a front view of the same clamp post holder 10. FIG. 3 is a side view of the same clamp post holder 10, but with part of a further clamp member 12 added in dotted lines. FIG. 4 is a side view of the same clamp post holder 10, but with the part of a further clamp member 12 added in solid lines. Further, the clamp post holder 10 has been adjusted. The effect of the adjustment is exaggerated for the purpose of this Figure.

The clamp post holder 10 has a body 14, with a mounting portion 16 and a post holding portion 18. A connecting portion 20 joins the mounting portion 16 and post holding portion 18 together. Elsewhere, they are separated by a narrow slot 22.

Mounting portion 16 is made up of a pair of flange portions 24, one on each side of a thicker central portion 26. Mounting portion 16 is generally rectangular when viewed from above (or below). Post holding portion 18 is on top of mounting portion 16. It is the same width and depth as the central portion 26 of mounting portion 16 and about the same height. The post holding portion 18 is also generally rectangular when viewed from above, except for a waisted portion 28 (which extends into the thicker part of the central portion 26 of mounting portion 16).

The mounting portion 16 is for mounting the clamp post holder 10 to a machine, such as a wire-bonding machine. Four mounting holes 30 on the flange portions 24 allow it to be fastened. Two of these are towards the front of the mounting portion 16 and one either side of the waisted portion 28 of the central portion 26 and the post holding portion 18. These mounting holes 30 are slightly elongate to allow it to be positioned adjustably.

The post holding portion 18 has a main, post hole 32 in the waisted portion 28. The post hole 32 extends down through the entire clamp post holder 10 from the top surface of the post holding portion 18, to the bottom of the mounting portion 16. This post hole 32 releasably and removably contains a clamp post 34 for mounting a clamp member 12, as shown in FIG. 3. The clamp post 34 is held in position in the post hole 32 by a screw 35 in a threaded clamp post fastening screw hole 36, thus preventing any vertical or rotational movement of clamp post 34 when the screw is tight.

The narrow slot 22 extends across the width of the post holding portion 18, from its front surface towards it rear surface. The inner end of the slot 22 coincides with a cylindrical pivot hole 38 passing across the width of the post holding portion 18, parallel to the front and rear surfaces. In this embodiment the slot 22 extends about two thirds of the way towards the rear surface and the diameter of the pivot hole 38, adds a further quarter of the way towards the rear surface. The diameter of the pivot hole 38 is about five times the width of the slot 22.

Towards the front of the post holding portion 18, and centrally, across the width, a threaded adjustment screw hole 40 extends down from the top of the post holding portion 18, into the slot 22. Whilst the adjustment screw hole 40 extends through the top surface of the slot 22, it does not extend into the bottom surface of the slot 22, that is the top of the central portion 26 of mounting portion 16. In use an adjustment screw 42 is threaded within screw hole 40 with its leading end in contact with the top surface 44 of the central portion 26.

If the adjustment screw 42 is tightened further when in contact with the top surface 44 of the central portion 26, it cannot screw into the top surface 44 of the central portion 26. Instead it tends to pull the moveable, post holding portion 18 away from the stationary, mounting portion 16. This is facilitated by pivot hole 38, which aids the flexing and pivoting that occurs. The post holding portion 18 is solid tool steel and therefore does not flex much, but this is all that is required. This flexing causes the clamp post 34 in the post hole 32 to pivot upwards and to the left by an angle "α" (as is shown in FIG. 4), corresponding to the outer end of the slot 22 being raised through distance "d". This, in turn, moves the clamp member 12 slightly to the left and moves its clamping end (not shown) downwards. The clamp post 34 itself does not bend, due to a sufficient gap in the lower part of post hole 32.

Thus, in use, a clamp member 12 is mounted on the clamp post 34 by way of screws 46 and moves up and down with the clamp post holder 10. When this is mounted in a wire-bonding machine, the clamp post holder 10 is used to help clamp lead frames during wire bonding. During setting up of a production run, fine positioning of the clamp member 12 can be achieved, both in terms of its lateral position and its vertical position, through adjustment of a screw 42 in the adjustment screw hole 40 (and also through the mounting holes 30 being slightly elongate).

In summary, the clamp post holder has a mounting portion for mounting on a wire bonding machine, and a clamp post holding portion, which holds a clamp post. The mounting portion and post holding portion are separated by a slot except for a connecting portion. A screw passes through a threaded hole in the clamp post holding portion into the slot, with its end abutting the mounting portion. By turning the screw, the clamp post holding portion is pulled away from the mounting portion, thereby moving the clamp post. This allows fine adjustment of the positioning of a clamp member on the clamp post to be relatively easy and quick to perform. The clamp post holder in accordance with one embodiment of the present invention also eliminates the need to add any shims, which have to be exactly right.

In an alternative embodiment the adjustment screw hole extends not just through the post holding portion 18, but also into the central portion 26 of mounting portion 16. However, it would only be threaded when passing through the post holding portion 18.

If required an even harder body can be present in the lower part of such a hole (or even at the top surface 44 of the central portion 26, or elsewhere) to provide a hard reaction surface for the screw, so that the relevant surface of the clamp post holder 10 is not damaged.

In another alternative embodiment the adjustment screw hole again extends not just through the post holding portion 18, but also into the stationary, central portion 26. However, the portion of the adjustment screw hole in the post holding portion 18, is not threaded, whilst the portion in the stationary, central portion 26 is. In this way, a screw can be used to tighten the post holding portion 18 and mounting portion 16 together. This would cause the clamp post 34 in the post hole 38 to pivot downwards and to the right (as viewed in FIG. 3). This, in turn, moves the clamp member 12 slightly to the right and moves its clamping end (not shown) upwards.

In yet another further embodiment both adjustment screw holes are present, one where the upper part is threaded and one where the lower part is threaded. In this way adjustment in either direction is possible, thus providing greater adjustment possibilities and making allowance for deforming of the clamp post holder 10 through use.

Various other possibilities exist. For instance the screw could be replaced by a threaded member (e.g. a bolt) fixed to one of the post holding portion 18 and mounting portion 16 and passing through a hole in the other. A nut on the threaded member mounted on that other one of the post holding portion 18 and mounting portion 16 could be used to tighten the post holding portion 18 and mounting portion 16 together. A nut threaded member within that other one of the post holding portion 18 and mounting portion 16 could be used to tighten the post holding portion 18 and mounting portion 16 together or pull them apart. In these cases the relative movement of the post holding portion 18 and mounting portion 16 is in a plane containing the axis of the threaded member. However, the threaded member can be in a different plane, for example transverse to it. For example the lifting of the post holding portion 18 could be achieved through the end of a threaded member contacting a cam surface.

Whilst the body of the clamp post holder 10 of the invention has been exemplified with a particular shape, various other shapes are of course possible. The main limitation for the shape of the mounting portion is the shape of the corresponding mounting part of the machine being used. The main limitation for the shape of the post holding portion is the need to allow access to mounting screws and adjustment screws.

The shape of the slot is not limited to that as shown. It does not need to be flat. It does not need to end in a cylindrical hole. The function is to allow one part of the clamp post holder to move relative to another.

In one embodiment embodiment, the relative movement of the two parts of the post holding portion relies on the flexibility of the material. It does not need to be very flexible but does need to allow some flexing without breaking. For instance a maximum movement "d" (see FIG. 4) of about 0.2 mm would be sufficient for a clamp post holder 10, being 22 mm from front to back (and about 20 mm from the point of flexing). This would give rise to an angle "α" of about 0.6°. Thus the portion connecting the movable and stationary parts of the post holding portions should not be too wide or too thin. In another possible embodiment, there could be a rotating hinge there instead.

In one embodiment embodiment, the body of the clamp post holder is a single piece of metal. It can, however, been made up of several pieces mounted onto each other.

Many other variations are possible within the scope of the present invention that is only limited as defined in the claims or elsewhere as indicated.

What is claimed is:

1. A clamp post holder, comprising:

a mounting portion for mounting the clamp post holder in a wire bonding apparatus;

a post holding portion for holding a clamp post and connected to the mounting portion by a connecting portion; and an operable threaded member having a lengthwise axis; wherein the threaded member passes from one of the mounting portion and post holding portion to the other of the mounting portion and post holding portion so as to cause rotation of the post holding portion relative to the mounting portion and about the connecting portion that causes a corresponding movement of the clamp post, wherein the movement of the clamp post causes a lead frame that is held by a clamp member mounted on the clamp post to move.

2. A clamp post holder according to claim 1, wherein the operable threaded member is a screw.

3. A clamp post holder according to claim 1, wherein the operable threaded member extends through a threaded hole in the post holding portion.

4. A clamp post holder according to claim 1, wherein the rotation is in a plane containing the axis of the threaded member.

5. A clamp post holder according to claim 1, wherein the mounting portion and post holding portion have opposing separate surfaces.

6. A clamp post holder according to claim 5, wherein the threaded member passes from the opposing surface of one of the mounting portion and post holding portion and contacts the other of the mounting portion and post holding portion.

7. A clamp post holder according to claim 5, wherein an end of the operable threaded member passes from the opposing surface of one of the mounting portion and post holding portion and contacts the opposing surface of the other of the mounting portion and post holding portion.

8. A clamp post holder according to claim 5, wherein the operable threaded member passes orthogonally from a surface of one of the mounting portion and post holding portion.

9. A clamp post holder according to claim 5, wherein the opposing surfaces of the mounting portion and post holding portion are separated by a gap.

10. A clamp post holder according to claim 5, wherein the opposing surfaces of the mounting portion and post holding portion extend to the connecting portion.

11. A clamp post holder according to claim 1, wherein the rotation of the post holding portion relative to the mounting portion bends the connecting portion.

12. A clamp for use in a wire bonding apparatus, comprising:

a mounting portion for mounting the clamp in the wire bonding apparatus;

a post holding portion holding a clamp post and connected to the mounting portion by a connecting portion;

a clamp member mounted on the clamp post, the clamp member for holding a lead frame; and an operable threaded member having a lengthwise axis, wherein the threaded member passes from one of the mounting portion and post holding portion to the other of the mounting portion and post holding portion such that the operation of the threaded member causes rotation of the post holding portion relative to the mounting portion and about the connecting portion, the rotation causing movement of the lead frame relative to the wire bonding apparatus.

13. A clamp according to claim 12, wherein the operable threaded member is a screw and wherein the operable threaded member extends through a threaded hole in the post holding portion.

14. A clamp according to claim 12, wherein the rotation is in a plane containing the axis of the threaded member.

15. A clamp according to claim 12, wherein the mounting portion and the post holding portion have opposing separate surfaces.

16. A clamp according to claim 12, wherein the rotation of the post holding portion relative to the mounting portion bends the connecting portion.

17. A method of holding a lead frame in a wire bond apparatus, the method comprising:

mounting a clamp in the wire bonding apparatus, the clamp comprising a mounting portion and a post holding portion connected to the mounting portion by a connecting portion;

clamping the lead frame in a clamp member mounted on a clamp post held by the post holding portion; and operating a threaded member that passes from one of the mounting portion and post holding portion to the other of the mounting portion and post holding portion, the operating causing rotation of the post holding portion relative to the mounting portion and about the connection portion, wherein the rotation causes movement of the lead frame relative to the wire bonding apparatus.

18. A method according to claim 17, wherein the operable threaded member is a screw and wherein the operable threaded member extends through a threaded hole in the post holding portion.

19. A method according to claim 17, wherein the rotation is in a plane containing the axis of the threaded member.

20. A method according to claim 17, wherein the mounting portion and the post holding portion have opposing separate surfaces.

* * * * *